United States Patent
Hsieh et al.

(10) Patent No.: US 10,211,254 B2
(45) Date of Patent: Feb. 19, 2019

(54) METHODS OF FABRICATING AN IMAGE SENSOR

(71) Applicant: HIMAX TECHNOLOGIES LIMITED, Tainan (TW)

(72) Inventors: Yu-Jui Hsieh, Tainan (TW); Po-Nan Chen, Tainan (TW); Ya-Jing Yang, Tainan (TW)

(73) Assignee: HIMAX TECHNOLOGIES LIMITED, Tainan (TW)

( * ) Notice: Subject to any disclaimer, the term of this patent is extended or adjusted under 35 U.S.C. 154(b) by 0 days.

(21) Appl. No.: 15/869,072

(22) Filed: Jan. 12, 2018

(65) Prior Publication Data

US 2018/0138233 A1 May 17, 2018

Related U.S. Application Data

(62) Division of application No. 15/261,997, filed on Sep. 11, 2016, now Pat. No. 9,917,134.

(51) Int. Cl.
*H01L 27/146* (2006.01)

(52) U.S. Cl.
CPC .... *H01L 27/14685* (2013.01); *H01L 27/1462* (2013.01); *H01L 27/14621* (2013.01); *H01L 27/14645* (2013.01); *H01L 27/14649* (2013.01)

(58) Field of Classification Search
CPC ......... H01L 27/14621; H01L 27/14685; H01L 27/14625; H01L 27/14645; H01L 27/14627
See application file for complete search history.

(56) References Cited

U.S. PATENT DOCUMENTS

| 8,593,538 | B2 | 11/2013 | Nagata | |
|---|---|---|---|---|
| 2012/0056073 | A1* | 3/2012 | Ahn | ................... H01L 27/14609 250/208.1 |
| 2014/0048691 | A1 | 2/2014 | Ovsiannikov et al. | |

FOREIGN PATENT DOCUMENTS

TW 201138076 A1 11/2011

* cited by examiner

*Primary Examiner* — Tony Tran
(74) *Attorney, Agent, or Firm* — CKC & Partners Co., Ltd.

(57) ABSTRACT

A method of fabricating an image sensor includes the following steps. A substrate is provided. A first infrared filter is formed on a first region of the substrate. A second infrared filter is deposited on the substrate and the first infrared filter. The deposited second infrared filter covers the first infrared filter. The second infrared filter is lowered to expose the first infrared filter. The lowered second infrared filter is on a second region of the substrate and neighbors the first infrared filter.

4 Claims, 10 Drawing Sheets

METHODS OF FABRICATING AN IMAGE SENSOR

RELATED APPLICATIONS

This application is a divisional application of U.S. Non-Provisional application Ser. No. 15/261,997, filed Sep. 11, 2016, which is incorporated herein by reference in its entirety.

BACKGROUND

Field of the Invention

The invention relates to an image sensor, and more particularly to methods of fabricating an image sensor which includes infrared detection function.

Description of Related Art

Image sensors have been widely used in various imaging applications and products, such as smart phones, digital cameras, scanners, etc. Furthermore, an image sensor with infrared detection function can detect infrared light as well as visible light, in order to obtain more information. With its capability of detecting infrared light, the image sensor with infrared detection function are applied for security applications, such as iris recognition, object detection, and the like.

SUMMARY

An objective of the invention is to provide methods of fabricating an image sensor with infrared detection which has higher image detection accuracy than that fabricated by the conventional art.

One aspect of the invention is directed to a method of fabricating an image sensor. The method includes the following steps. A substrate is provided. A first infrared filter is formed on a first region of the substrate. A second infrared filter is deposited on the substrate and the first infrared filter. The deposited second infrared filter covers the first infrared filter. The second infrared filter is lowered to expose the first infrared filter. The lowered second infrared filter is on a second region of the substrate and neighbors the first infrared filter.

In accordance with one or more embodiments of the invention, a height of the lowered second infrared filter is substantially equal to or lower than a height of the first infrared filter.

In accordance with one or more embodiments of the invention, the method includes the following steps. A planarization layer is formed on the first infrared filter and the lowered second infrared filter. A third infrared filter is formed on the planarization layer and above the first infrared filter. A color filter is formed on the planarization layer and above the lowered second infrared filter.

In accordance with one or more embodiments of the invention, the third infrared filter is an infrared pass filter.

In accordance with one or more embodiments of the invention, the color filter is formed having a red light filtering portion, a blue light filtering portion and a green light filtering portion.

In accordance with one or more embodiments of the invention, the first infrared filter is an infrared pass filter.

In accordance with one or more embodiments of the invention, the first infrared filter is a white filter.

In accordance with one or more embodiments of the invention, the second infrared filter is an infrared cutoff filter.

In accordance with one or more embodiments of the invention, the first infrared filter is formed including a photo-type material.

In accordance with one or more embodiments of the invention, the substrate is provided having a first photodiode in the first region for detecting infrared light and at least a second photodiode in the second region for detecting visible light.

Another aspect of the invention is directed to a method of fabricating an image sensor. The method includes the following steps. A substrate is provided, which has a first region and a second region. A planarization layer is formed on the substrate. A first infrared filter is formed on the planarization layer and above the first region of the substrate. A color filter is formed on the planarization layer and above the second region of the substrate. A second infrared filter is formed on the first infrared filter. A third infrared filter is deposited on the color filter and the second infrared filter. The deposited third infrared filter covers the second infrared filter. The third infrared filter is lowered to expose the second infrared filter. The lowered third infrared filter is on a second region of the substrate and neighbors the second infrared filter.

In accordance with one or more embodiments of the invention, a height of the lowered third infrared filter is substantially equal to or lower than a height of the second infrared filter.

In accordance with one or more embodiments of the invention, the first infrared filter is an infrared pass filter.

In accordance with one or more embodiments of the invention, the second infrared filter is an infrared pass filter.

In accordance with one or more embodiments of the invention, the second infrared filter is a white filter.

In accordance with one or more embodiments of the invention, the third infrared filter is an infrared cutoff filter.

In accordance with one or more embodiments of the invention, the second infrared filter is formed including a photo-type material.

In accordance with one or more embodiments of the invention, the color filter is formed having a red light filtering portion, a blue light filtering portion and a green light filtering portion.

In accordance with one or more embodiments of the invention, the substrate is provided having a first photodiode in the first region for detecting infrared light and at least a second photodiode in the second region for detecting visible light.

Another aspect of the invention is directed to a method of fabricating an image sensor. The method includes the following steps. A substrate is provided, which has a first region and a second region. A planarization layer is formed on the substrate. A color filter is formed on the planarization layer and above the first region of the substrate. An infrared pass filter is formed on the planarization layer and above the second region of the substrate. An infrared cutoff filter is deposited on the color filter and the infrared pass filter. The deposited infrared cutoff filter covers the infrared pass filter. The infrared cutoff filter is lowered to expose the infrared pass filter. The lowered infrared cutoff filter is on the second region of the substrate and neighbors the infrared pass filter.

BRIEF DESCRIPTION OF THE DRAWINGS

The foregoing aspects and many of the accompanying advantages of this invention will become more readily appreciated as the same becomes better understood by reference to the following detailed description, when taken in conjunction with the accompanying drawings.

DETAILED DESCRIPTION

The detailed explanation of the invention is described as following. The described preferred embodiments are presented for purposes of illustrations and description, and they are not intended to limit the scope of the invention.

Figure 1:
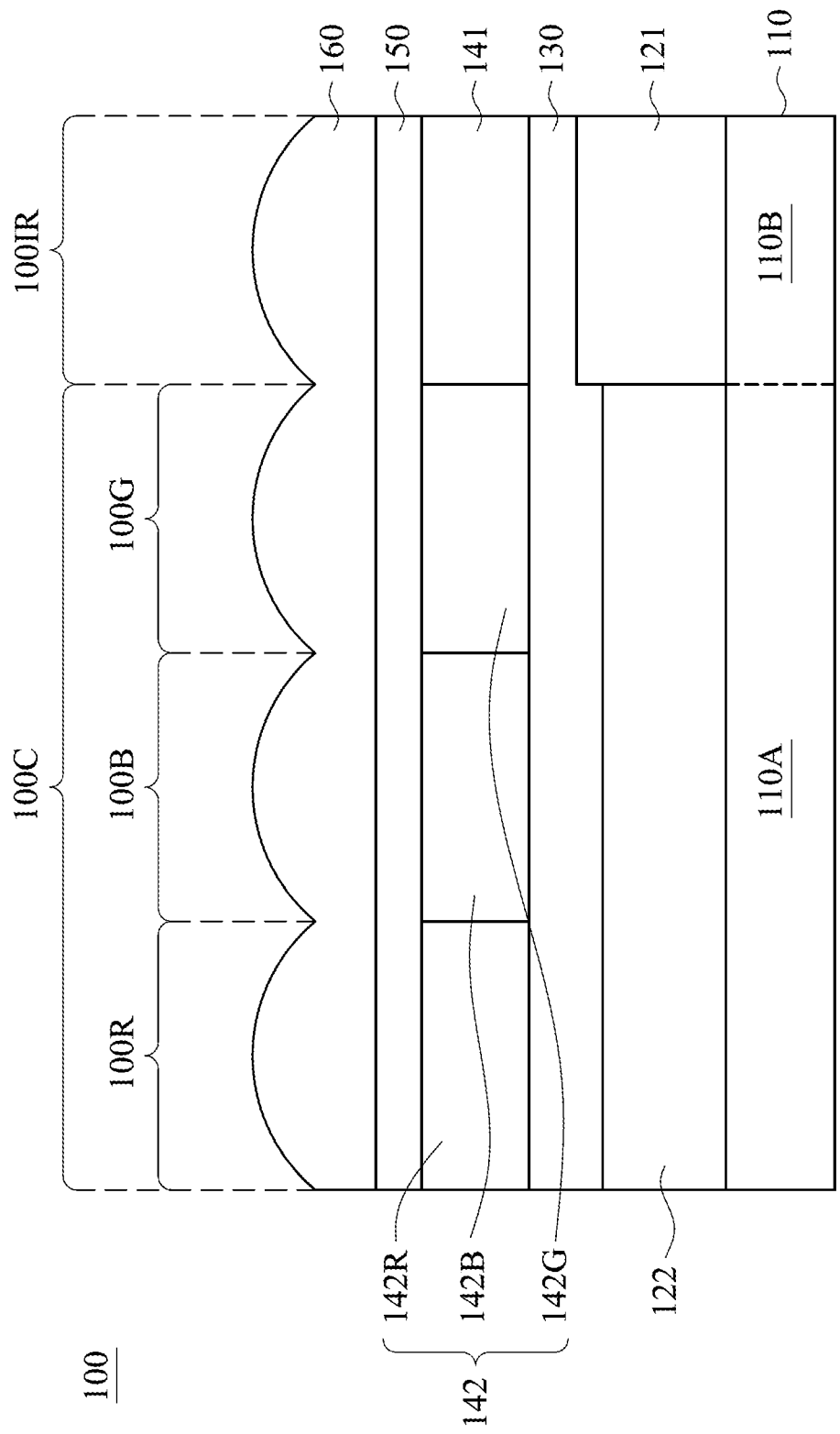
FIG. 1 illustrates a cross sectional view of an image sensor in accordance with some embodiments of the invention.

Referring to FIG. 1, which illustrates a cross sectional view of an image sensor 100 in accordance with some embodiments of the invention. The image sensor 100 may be a BSI (back-side illuminated) or FSI (front-side illuminated) complementary metal oxide semiconductor (CMOS) image sensor, a charge coupled device (CCD) image sensor or another similar image sensor. The image sensor 100 includes sensing pixels arranged in a matrix. Each sensing pixel has a color pixel area 100C for detecting visible light and an infrared pixel area 100IR for detecting infrared light. For facilitating description, FIG. 1 only illustrates a color pixel area 100C and an infrared pixel area 100IR (i.e. a sensing pixel). The color pixel area 100C includes a red pixel area 100R for detecting incident light in a red color wavelength band, a blue pixel area 100B for detecting incident light in a blue color wavelength band and a green pixel area 100G for detecting incident light in a green color wavelength band.

The image sensor 100 includes a substrate 110, a first infrared filter 121, a second infrared filter 122, a planarization layer 130, a third infrared filter 141, a color filter 142, a spacer layer 150 and a microlens layer 160. As shown in FIG. 1, the substrate 110 has a visible light sensing region 110A and an infrared light sensing region 110G for each sensing pixel. In the substrate 110, three photodiodes (not shown) may be respectively arranged in the red pixel area 100R, the blue pixel area 100B and the green pixel area 100G for detecting red light, blue light and green light, and an infrared photodiode (not shown) may be arranged in the infrared pixel area 100IR for detecting infrared light.

The first infrared filter 121 is disposed on the infrared light sensing region 110G of the substrate 110 for permitting infrared light to pass therethrough. In some embodiments, the first infrared filter 121 is an infrared pass filter, which may block incident light with a frequency lower than 850 nm.

The second infrared filter 122 is disposed on the visible light sensing region 110A of the substrate 110 and neighbors the first infrared filter 121 for permitting visible light to pass therethrough. In some embodiments, the second infrared filter 122 is an infrared cutoff filter, which may block incident light with a frequency higher than 850 nm.

The planarization layer 130 is disposed on the first infrared filter 121 and the second infrared filter 122 to provide a flat surface for the third infrared filter 141 and the color filter 142 to be disposed thereon. The third infrared filter 141 and the color filter 142 are disposed in the infrared pixel area 100IR and the color pixel area 100C, respectively. The third infrared filter 141 permits infrared light to pass therethrough as well as the first infrared filter 121. In some embodiments, the third infrared filter 141 is an infrared pass filter, which may block incident light with a frequency lower than 850 nm. In such case, the first infrared filter 121 may alternatively be a white filter for permitting infrared light and visible light to pass therethrough, so as to improve its luminous flux. The color filter 142 has a red light filtering portion 142R, a blue light filtering portion 142B and a green light filtering portion 142G, which allows red light, blue light and green light to pass therethrough, respectively.

The spacer layer 150 is disposed on the third infrared filter 141 and the color filter 142, and a microlens layer 160 is disposed on the spacer layer 150. The spacer layer 150 is disposed to keep the microlens layer 160 apart from the third infrared filter 141 and the color filter 142. As shown in FIG. 1, the microlens layer 160 has convex shapes at its light receiving side for focusing incident light onto the photodiodes (not shown) and the infrared photodiode (not shown), in order to increase light sensitivity of the image sensor 100. Each convex shape corresponds to a subpixel area (i.e. the red pixel area, the blue pixel area, the green pixel area or the infrared pixel area). In another embodiment, the microlens layer 160 may alternatively be directly disposed on the third infrared filter 141 and the color filter 142.

Figure 2A:
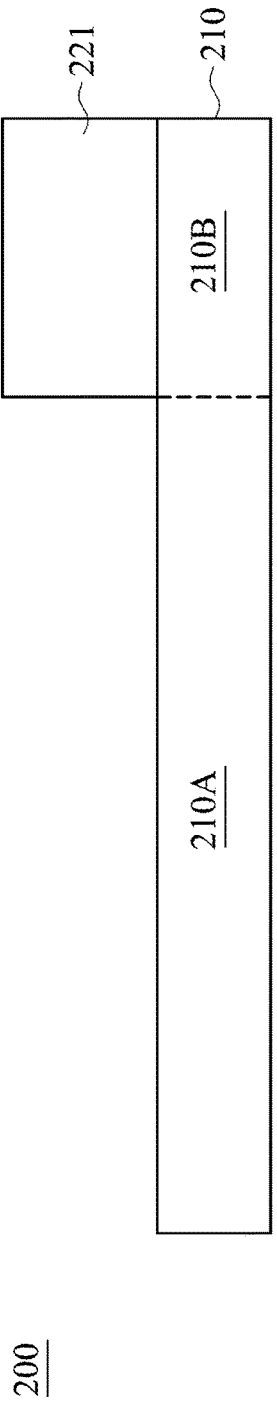
FIGS. 2A-2E illustrate schematic cross-sectional views of intermediate stages illustrating a method for fabricating an image sensor in accordance with some embodiments of the invention.

Referring to FIGS. 2A-2E, which illustrate schematic cross-sectional views of intermediate stages illustrating a method for fabricating an image sensor 200 in accordance with some embodiments of the invention. The image sensor 200 may be the image sensor 100 shown in FIG. 1 or another similar image sensor. In FIG. 2A, a substrate 210 is provided, and a first infrared filter 221 is formed on the substrate 210. The substrate 210 may be formed including, but not limited to, a semiconductor wafer, a silicon-on-insulator (SOI) substrate or a glass substrate. The substrate 210 has a visible light sensing region 210A and an infrared light sensing region 210B for each sensing pixel, and may be provided having three photodiodes (not shown) in the visible light sensing region 210A for respectively detecting red light, blue light and green light and an infrared photodiode (not shown) in the infrared light sensing region 210B for detecting infrared light. The first infrared filter 221 may be an infrared pass filter, which is formed for permitting infrared light to pass therethrough. The first infrared filter 221 may be formed including a photo-type material, and may be formed on the substrate 210 and above the infrared light sensing region 210B by utilizing a lithographic patterning process or another suitable process. In alternative embodiments, the first infrared filter 221 may be a white filter, which is formed for permitting infrared light and visible light to pass therethrough, so as to improve its luminous flux.

Figure 2B:
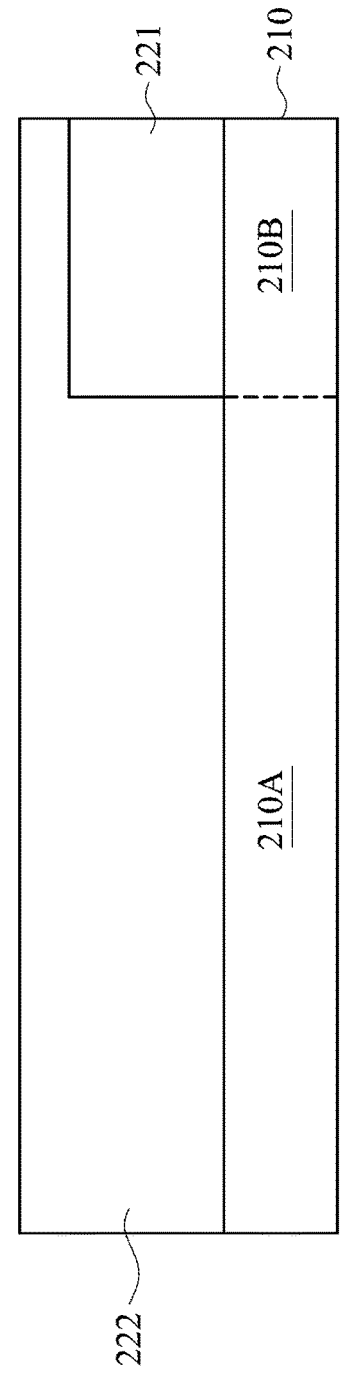

In FIG. 2B, a second infrared filter 222 is formed on the first infrared filter 221. The second infrared filter 222 may be an infrared cut-off filter formed including an etchable material by utilizing a coating process or another suitable process.

Figure 2C:
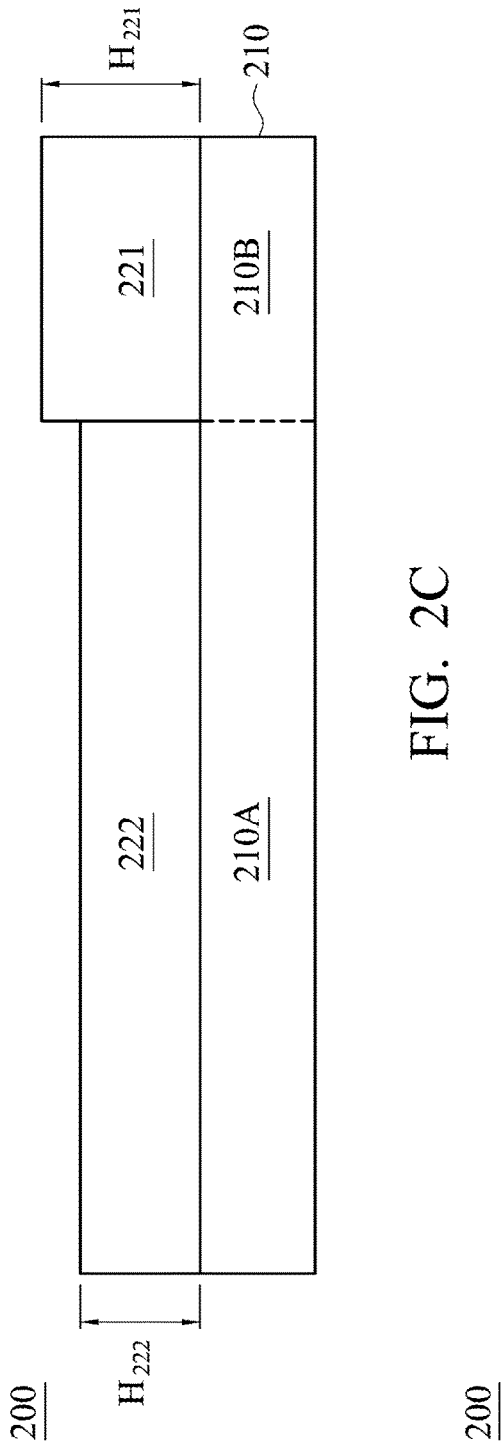

In FIG. 2C, the second infrared filter 222 is lowered to expose the first infrared filter 221 by utilizing an etching back process. After lowering the second infrared filter 222, the height $H_{222}$ of the second infrared filter 222 is equal to or shorter than the height $H_{221}$ of the first infrared filter 221. In certain embodiments, the roughness of the upper surface of the second infrared filter 222 is greater than that of the first infrared filter 221.

Figure 2D:
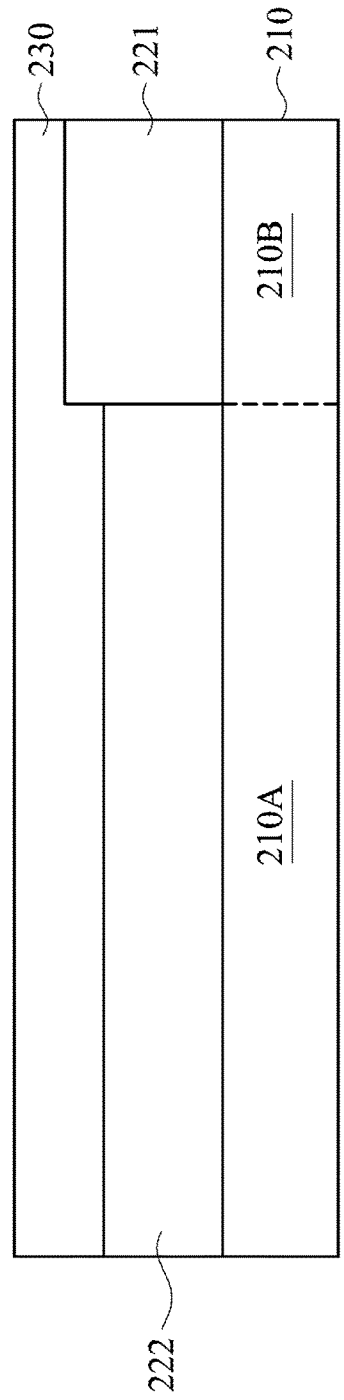

In FIG. 2D, a planarization layer 230 is formed on the first infrared filter 221 and second infrared filter 222. The planarization layer 230 may be formed including an acrylic material, an epoxy material or another suitable material by utilizing a coating process.

Figure 2E:
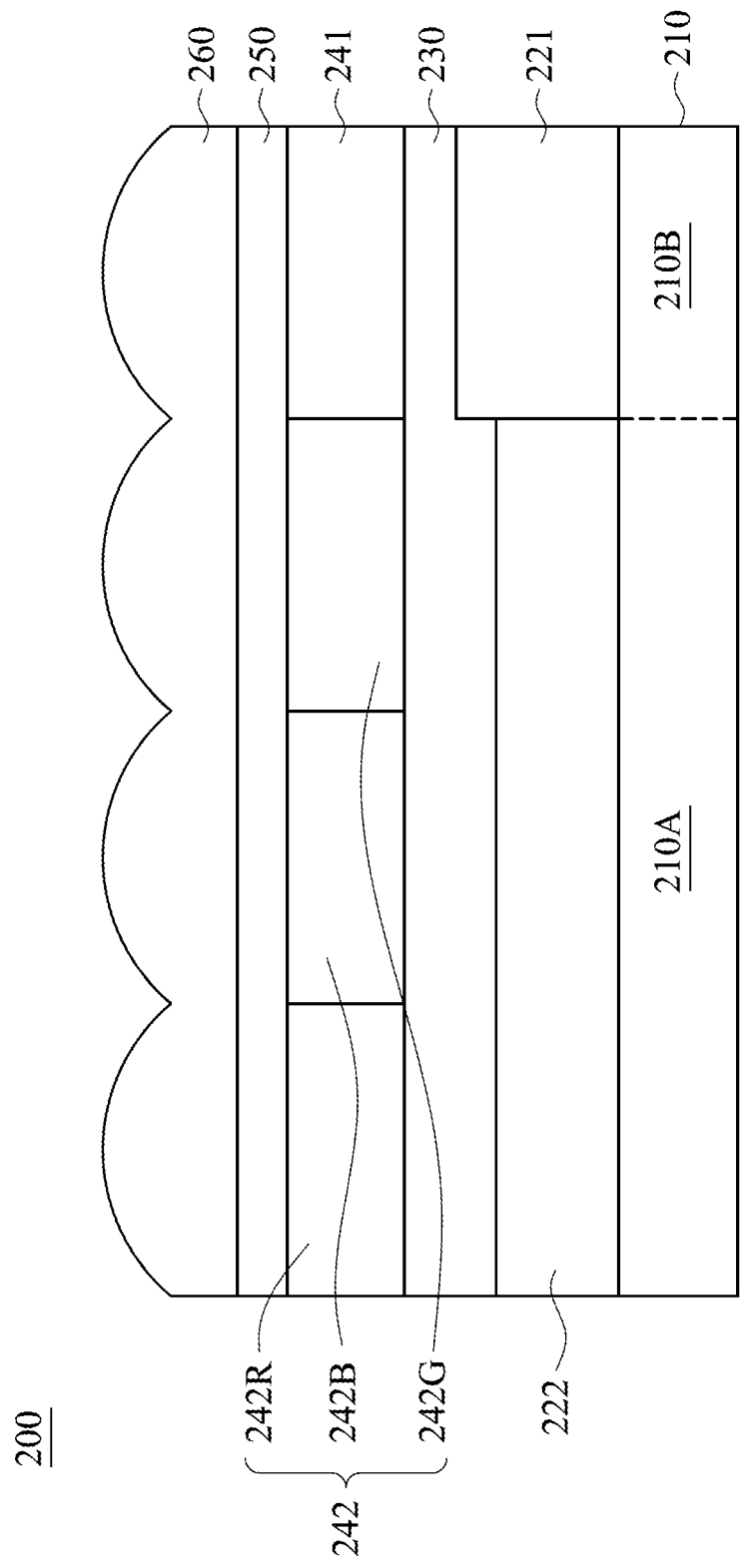

In FIG. 2E, a third infrared filter 241 and a color filter 242 are formed on the planarization layer 230, and a spacer layer 250 and a microlens layer 260 are sequentially formed on the third infrared filter 241 and the color filter 242. The third infrared filter 241 may be an infrared pass filter formed including a photo-type material, and may be formed on the planarization layer 230 and above the infrared light sensing region 210B by utilizing a lithographic patterning process or another suitable process. The color filter 242 is formed having a red light filtering portion 242R, a blue light filtering portion 242B and a green light filtering portion 242G above the visible light sensing region 210A, and each of the red light filtering portion 242R, the blue light filtering portion 242B and the green light filtering portion 242G may be formed including dyed or pigmented organic polymer with a desired color by utilizing a patterning process and other suitable processes known in the art. The spacer layer 250 may be formed including a glass material or another optical transparent material by utilizing a deposition process or other processes known in the art. The microlens layer 260 may be formed including any suitable material with high transmittance, such as acrylic polymer or another suitable material. The microlens layer 260 is formed with convex shapes at its light receiving side and respectively corresponding the red light filtering portion 242R, the blue light filtering portion 242B and the green light filtering portion 242G by utilizing a spin-on technique. Such method is performed to produce the microlens layer 260 with a substantially uniform thickness for each convex portion. In some embodiments, other processes, such as physical vapor deposition (PVD), chemical vapor deposition (CVD), and/or the like, may also be performed for forming the microlens layer 260. In alternative embodiments, the microlens layer 260 is directly formed on the third infrared filter 241 and the color filter 242.

In the method illustrated in FIGS. 2A-2E, the second infrared filter 222 formed by an etching back process rather than a patterning process, and thus it can be ensured that the first infrared filter 221 and the second infrared filter 222 are formed without a gap therebetween, such that the image sensor provides higher image detection accuracy.

Figure 3:
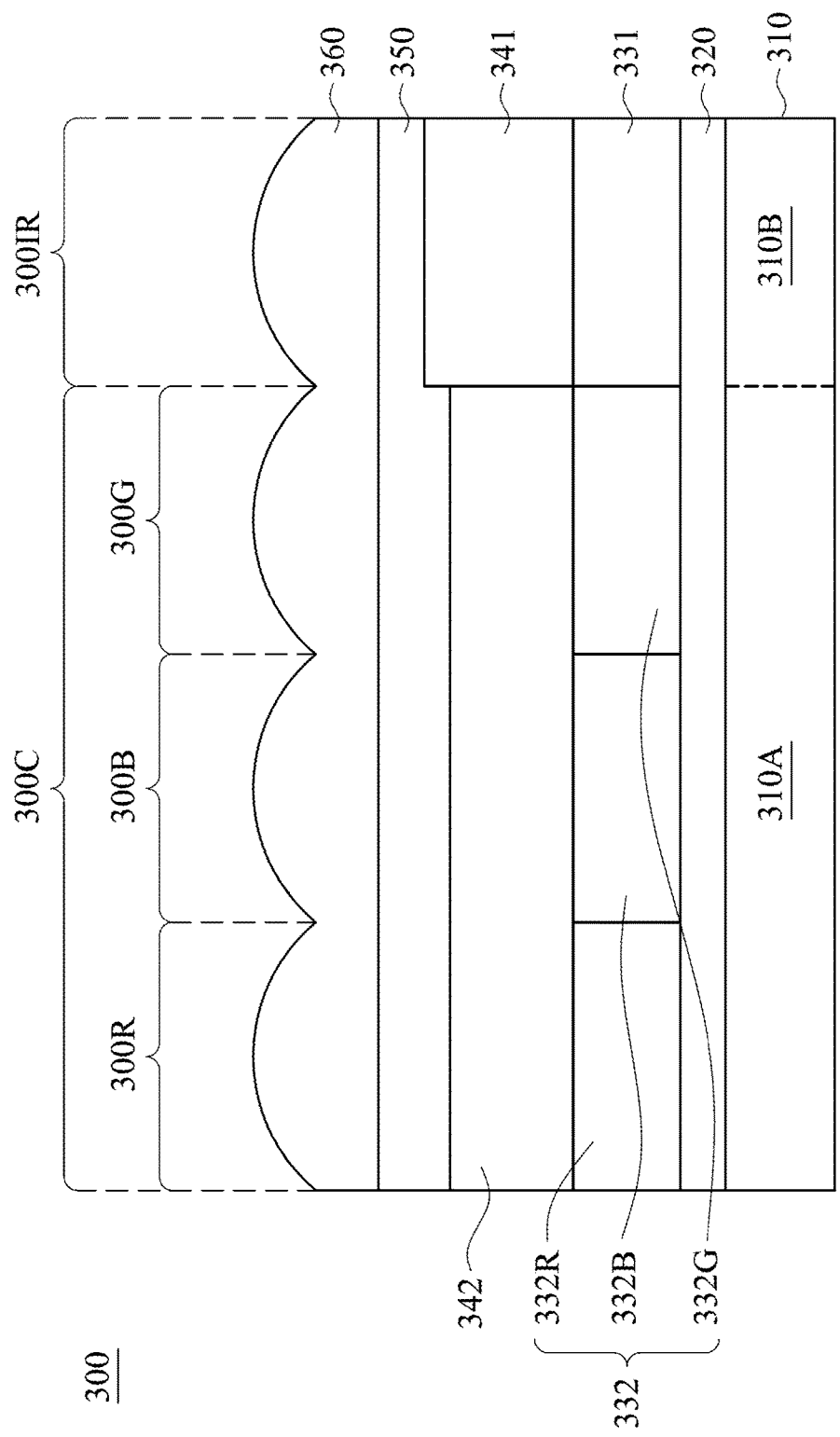
FIG. 3 illustrates a cross sectional view of an image sensor in accordance with some embodiments of the invention.

Referring to FIG. 3, which illustrates a cross sectional view of an image sensor 300 in accordance with some embodiments of the invention. Similar to the image sensor 100 in FIG. 1, the image sensor 300 may be a BSI or FSI CMOS image sensor, a CCD image sensor or another similar image sensor. The image sensor 300 includes sensing pixels arranged in a matrix. Each sensing pixel has a color pixel area 300C for detecting visible light and an infrared pixel area 300IR for detecting infrared light. For facilitating description, FIG. 3 only illustrates a color pixel area 300C and an infrared pixel area 300IR (i.e. a sensing pixel). The color pixel area 300C includes a red pixel area 300R for detecting incident light in a red color wavelength band, a blue pixel area 300B for detecting incident light in a blue color wavelength band and a green pixel area 300G for detecting incident light in a green color wavelength band.

The image sensor 300 includes a substrate 310, a planarization layer 320, a first infrared filter 331, a color filter 332, a second infrared filter 341, a third infrared filter 342, a spacer layer 350 and a microlens layer 360. As shown in FIG. 3, the substrate 310 has a visible light sensing region 310A and an infrared light sensing region 310B for each sensing pixel. In the substrate 310, three photodiodes (not shown) may be respectively arranged in the red pixel area 300R, the blue pixel area 300B and the green pixel area 300G for detecting red light, blue light and green light, and an infrared photodiode (not shown) may be arranged in the infrared pixel area 300IR for detecting infrared light.

The planarization layer 320 is disposed on the substrate 310 to provide a flat surface for the first infrared filter 331 and the color filter 332 to be disposed thereon. The first infrared filter 331 and the color filter 332 are disposed in the infrared pixel area 300IR and the color pixel area 300C, respectively, for respectively permitting infrared light and visible light to pass therethrough. In some embodiments, the first infrared filter 331 is an infrared pass filter, which may block incident light with a frequency lower than 850 nm. The color filter 332 has a red light filtering portion 332R, a blue light filtering portion 332B and a green light filtering portion 332G, which allows red light, blue light and green light to pass therethrough, respectively.

The second infrared filter 341 is disposed on the infrared light sensing region 310B of the substrate 310 for permitting infrared light to pass therethrough. In some embodiments, the second infrared filter 341 is an infrared pass filter, which may block incident light with a frequency lower than 850 nm. In alternative embodiments, the second infrared filter 341 is a white filter for permitting infrared light and visible light to pass therethrough, so as to improve its luminous flux.

The second infrared filter 342 is disposed on the visible light sensing region 310A of the substrate 310 and neighbors the first infrared filter 341 for permitting visible light to pass therethrough. In some embodiments, the second infrared filter 342 is an infrared cutoff filter, which may block incident light with a frequency higher than 850 nm.

The spacer layer 350 is disposed on the second infrared filter 341 and the third infrared filter 342, and a microlens layer 360 is disposed on the spacer layer 350. The spacer layer 350 is disposed to keep the microlens layer 360 apart from the second infrared filter 341 and the third infrared filter 342. As shown in FIG. 3, the microlens layer 360 has convex shapes at its light receiving side for focusing incident light onto the photodiodes (not shown) and the infrared photodiode (not shown), in order to increase light sensitivity of the image sensor 300. Each convex shape corresponds to a subpixel area (i.e. the red pixel area, the blue pixel area, the green pixel area or the infrared pixel area). In another embodiment, the microlens layer 360 may alternatively be directly disposed on the second infrared filter 341 and the third infrared filter 342.

Figure 4A:
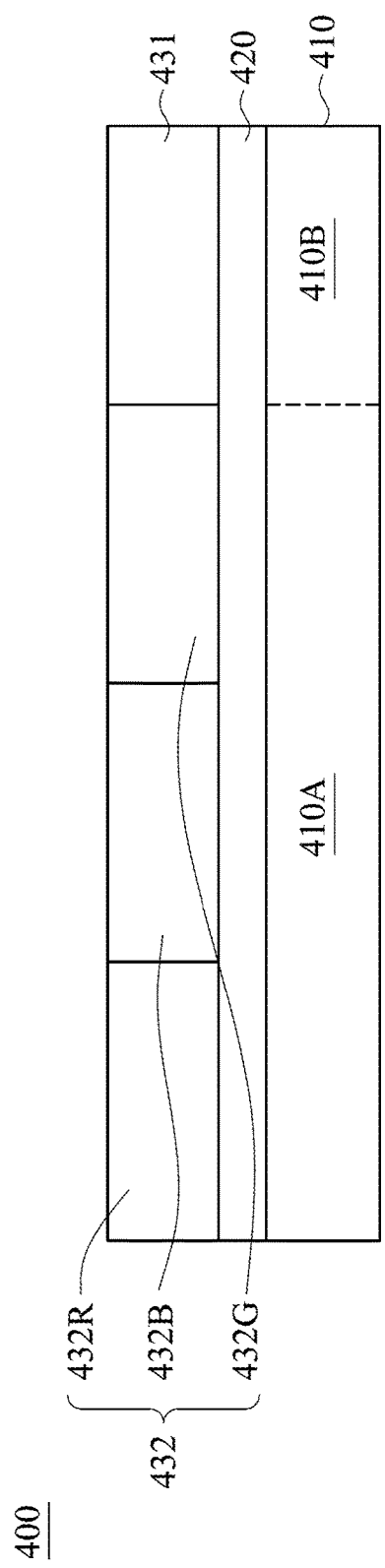
FIGS. 4A-4E illustrate schematic cross-sectional views of intermediate stages illustrating a method for fabricating an image sensor in accordance with some embodiments of the invention.

Referring to FIGS. 4A-4E, which illustrate schematic cross-sectional views of intermediate stages illustrating a method for fabricating an image sensor 400 in accordance with some embodiments of the invention. The image sensor 400 may be the image sensor 300 shown in FIG. 3 or another similar image sensor. In FIG. 4A, a substrate 410 is provided, a planarization layer 420 is formed on the substrate 410, and a first infrared filter 431 and a color filter are formed on the planarization layer 420. The substrate 410 may be formed including, but not limited to, a semiconductor wafer, an SOI substrate or a glass substrate. The substrate 410 has a visible light sensing region 410A and an infrared light sensing region 410B for each sensing pixel, and may be provided having three photodiodes (not shown) in the visible light sensing region 410A for respectively detecting red light, blue light and green light and an infrared photodiode (not shown) in the infrared light sensing region 410B for detecting infrared light. The planarization layer 420 may be formed including an acrylic material, an epoxy material or another suitable material by utilizing a coating process. The first infrared filter 431 may be an infrared pass filter formed including a photo-type material, and may be formed on the planarization layer 420 and above the infrared light sensing region 410B by utilizing a lithographic patterning process or another suitable process. The color filter 432 is formed having a red light filtering portion 432R, a blue light filtering portion 432B and a green light filtering portion 432G above the visible light sensing region 410A, and each of the red light filtering portion 432R, the blue light filtering portion 432B and the green light filtering portion 432G may be formed including dyed or pigmented organic polymer with a desired color by utilizing a patterning process and other suitable processes known in the art.

Figure 4B:
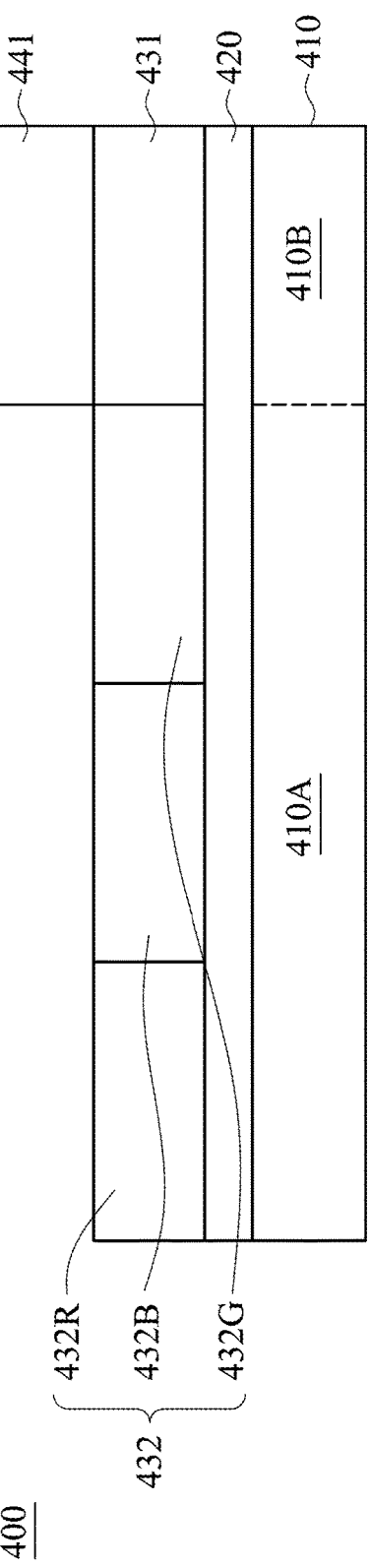

In FIG. 4B, a second infrared filter 441 is formed on the first infrared filter 431. The second infrared filter 441 may be an infrared pass filter, which is formed for permitting infrared light to pass therethrough. The second infrared filter 441 may be formed including a photo-type material by utilizing a lithographic patterning process or another suitable process. In alternative embodiments, the second infrared filter 441 may be a white filter, which is formed for permitting infrared light and visible light to pass therethrough, so as to improve its luminous flux.

Figure 4C:
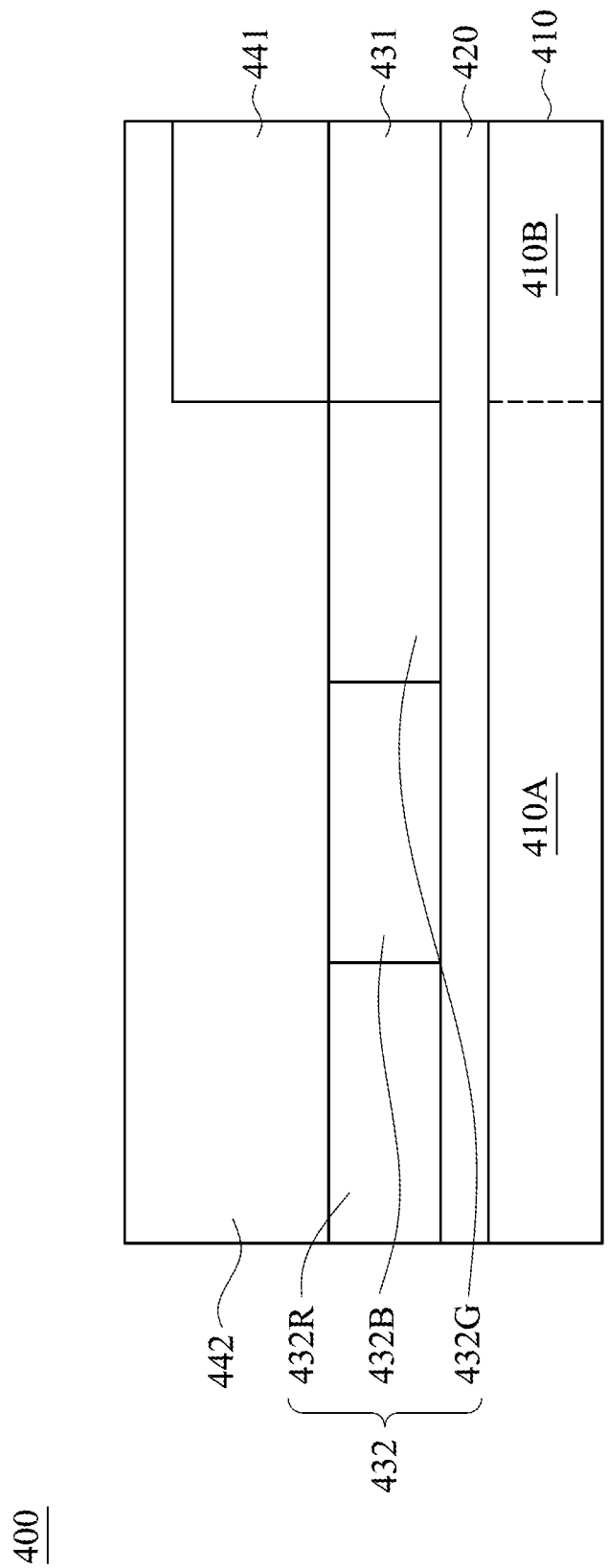

In FIG. 4C, a third infrared filter 442 is formed on the first infrared filter 221. The third infrared filter 442 may be an infrared cut-off filter formed including an etchable material by utilizing a coating process or another suitable process.

Figure 4D:
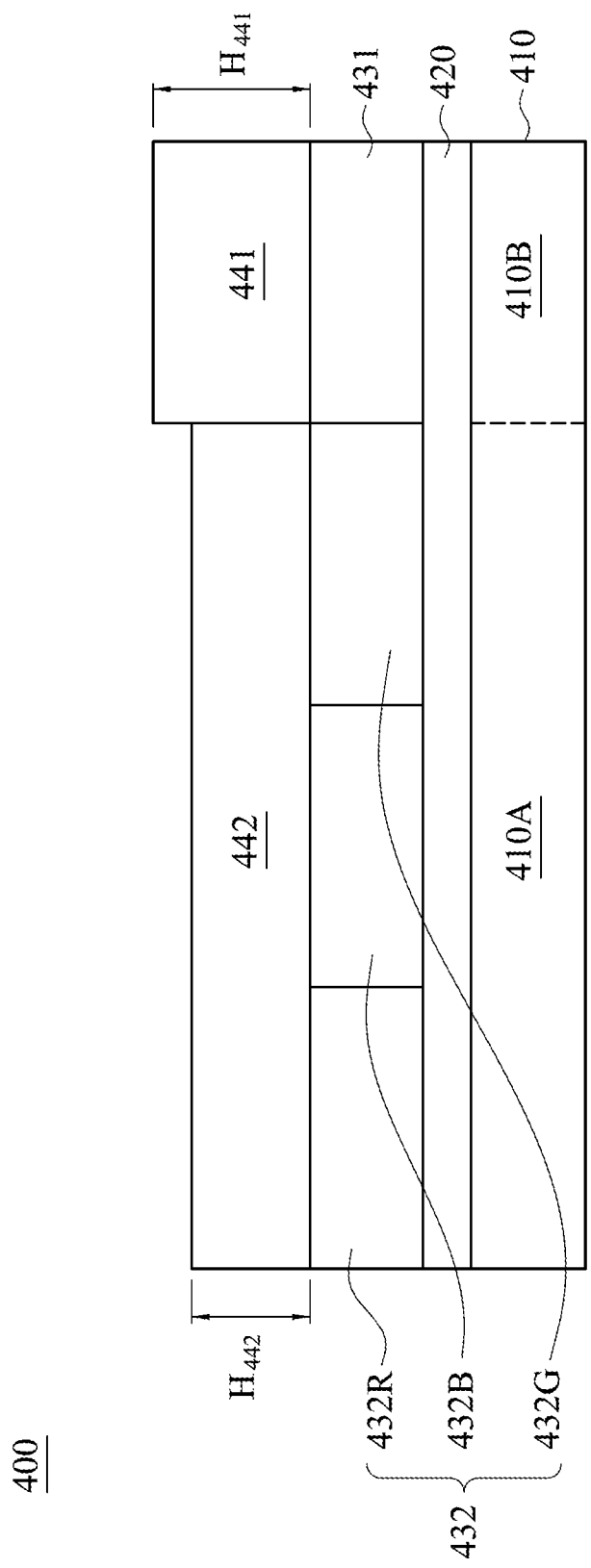

In FIG. 4D, the third infrared filter 442 is lowered to expose the second infrared filter 441 by utilizing an etching back process. After lowering the third infrared filter 442, the height $H_{442}$ of the third infrared filter 442 is equal to or shorter than the height $H_{441}$ of the second infrared filter 441. In certain embodiments, the roughness of the upper surface of the third infrared filter 442 is greater than that of the second infrared filter 441.

Figure 4E:
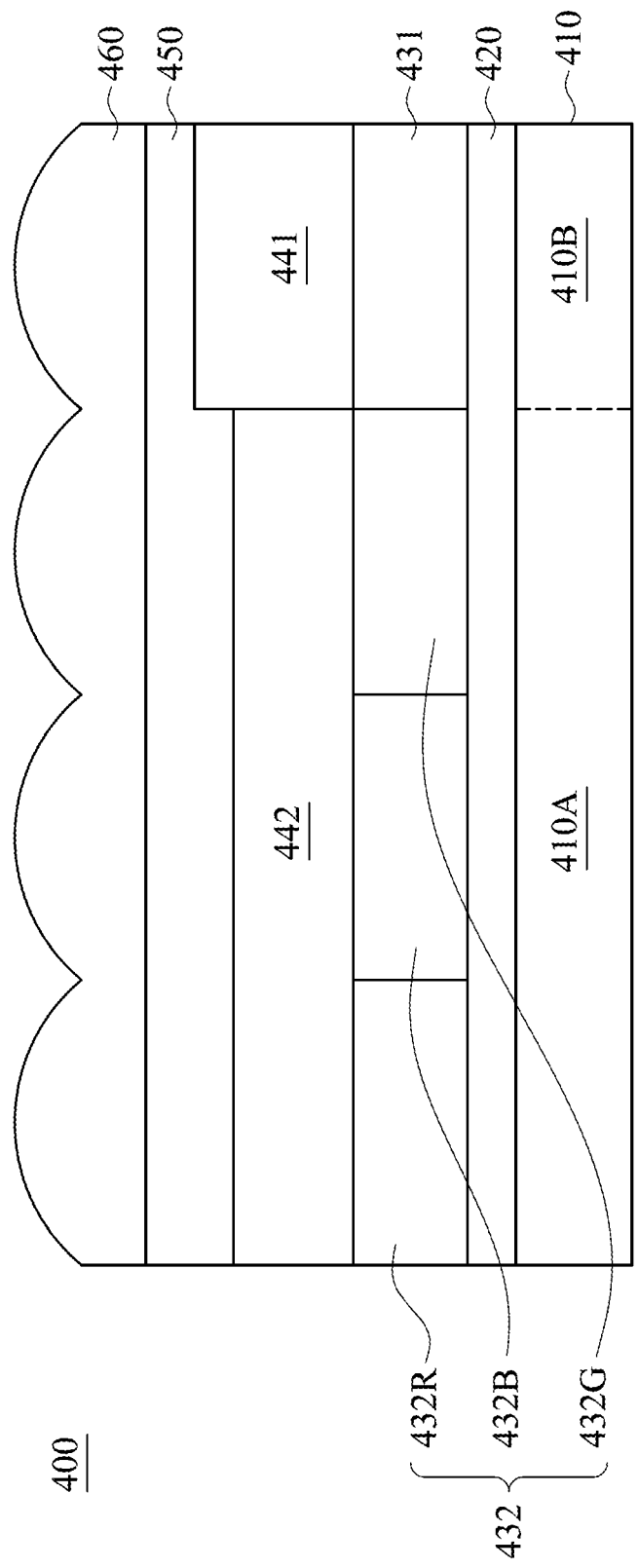

In FIG. 4E, a spacer layer 450 and a microlens layer 460 are sequentially formed on the second infrared filter 441 and the third infrared filter 442. The spacer layer 450 may be formed including a glass material or another optical transparent material by a deposition process or other processes known in the art. The microlens layer 460 may be formed including any suitable material with high transmittance, such as acrylic polymer or another suitable material. The microlens layer 460 is formed with convex shapes at its light receiving side and respectively corresponding the red light filtering portion 432R, the blue light filtering portion 432B and the green light filtering portion 432G by utilizing a spin-on technique. Such method is performed to produce the microlens layer 460 with a substantially uniform thickness for each convex portion. In some embodiments, other processes, such as PVD, CVD, and/or the like, may also be performed for forming the microlens layer 460. In alternative embodiments, the microlens layer 460 is directly formed on the second infrared filter 441 and the third infrared filter 442.

Similar to the method illustrated in FIGS. 2A-2E, in the method illustrated in FIGS. 4A-4E, the third infrared filter 442 formed by an etching back process rather than a patterning process, and thus it can be ensured that the second infrared filter 441 and the third infrared filter 442 are formed without a gap therebetween, such that the image sensor provides higher image detection accuracy.

Figure 5:
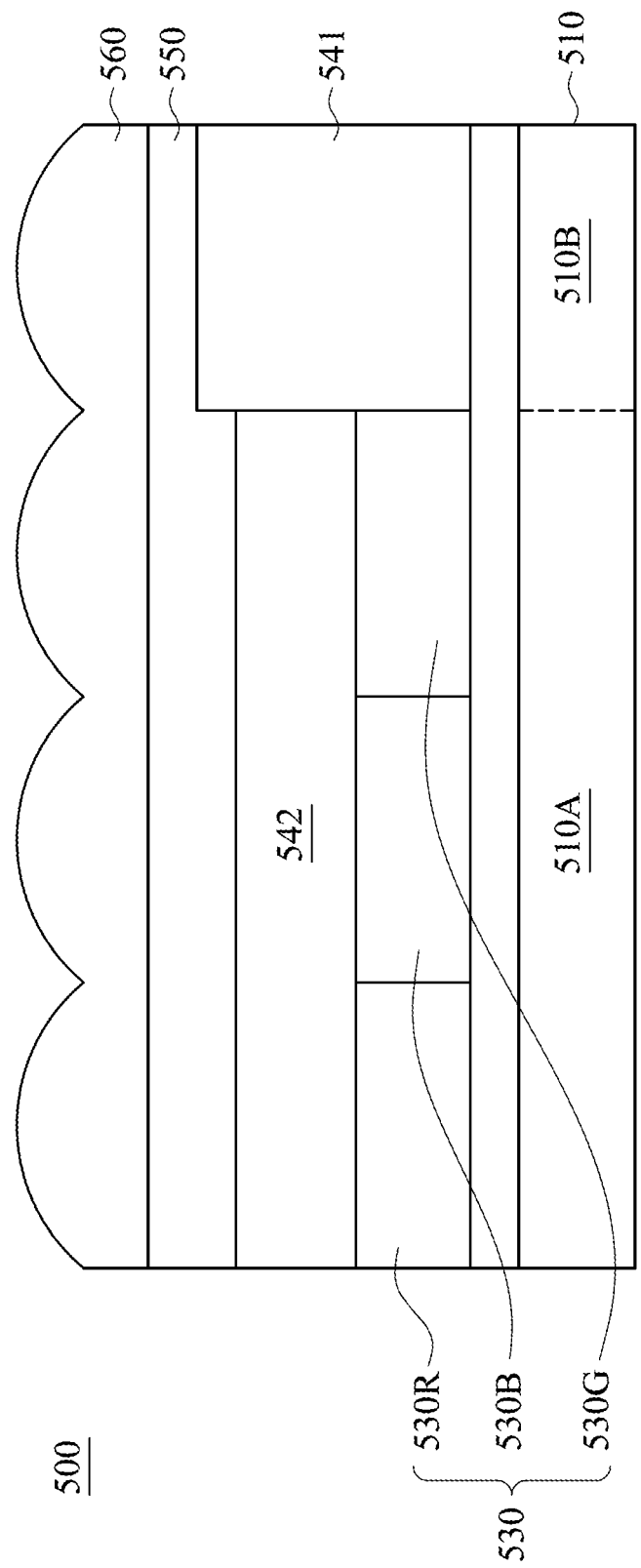
FIG. 5 illustrates a cross sectional view of an image sensor in accordance with some embodiments of the invention.

Referring to FIG. 5, which illustrates a cross sectional view of an image sensor 500 in accordance with some embodiments of the invention. The image sensor 500 includes a substrate 510 (with a visible light sensing region 510A and an infrared light sensing region 510B), a planarization layer 520, a color filter 530 (with a red light filtering portion 530R, a blue light filtering portion 530B and a green light filtering portion 530G), a first infrared filter 541, a second infrared filter 542, a spacer layer 550 and a microlens layer 560. In comparison with the image sensor 300, in the image sensor 500, only one infrared filter structure (i.e. the first infrared filter 541) is disposed above the infrared light sensing region 510 6. The first infrared filter 541 may be an infrared pass filter, which is formed including a photo-type material by utilizing a lithographic patterning process or another suitable process, as well as the first infrared filter 431 of the image sensor 400. The other elements of the image sensor 500, i.e., the substrate 510, the planarization layer 520, the color filter 530, the second infrared filter 542, the spacer layer 550 and the microlens layer 560, are approximately the same as the substrate 310, the planarization layer 320, the color filter 330, the third infrared filter 342, the spacer layer 350 and the microlens layer 360 of the image sensor 300, respectively, and the description is not described again herein.

It will be apparent to those skilled in the art that various modifications and variations can be made to the structure of the invention without departing from the scope or spirit of the invention. In view of the foregoing, it is intended that the invention cover modifications and variations of this invention provided they fall within the scope of the following claims.

What is claimed is:

1. A method of fabricating an image sensor, comprising:
providing a substrate having a first region and a second region;
forming a planarization layer vertically on the substrate;
forming a infrared pass filter vertically on the planarization layer and above the first region of the substrate;
forming a color filter vertically on the planarization layer and above the second region of the substrate, the color filter formed having a red light filtering portion, a blue light filtering portion and a green light filtering portion;
forming a white filter vertically on the infrared pass filter;
depositing a infrared cutoff filter vertically on the color filter and the white filter, wherein the deposited infrared cutoff filter covers the white filter; and
lowering the infrared cutoff filter to expose the white filter, wherein the lowered infrared cutoff filter is vertically on a second region of the substrate and laterally neighbors the white filter.

2. The method of claim 1, wherein a height of the lowered infrared cutoff filter is substantially equal to or lower than a height of the white filter.

3. The method of claim 1, wherein the white filter is formed including a photo-type material.

4. The method of claim 1, wherein the substrate is provided having a first photodiode in the first region for detecting infrared light and at least a second photodiode in the second region for detecting visible light.

* * * * *